United States Patent
Watanabe et al.

[11] Patent Number: 6,167,111
[45] Date of Patent: Dec. 26, 2000

[54] EXPOSURE APPARATUS FOR SYNCHROTRON RADIATION LITHOGRAPHY

[75] Inventors: Yutaka Watanabe, Tochigi-ken; Shunichi Uzawa, Tokyo; Yasuaki Fukuda, Utsunomiya; Nobutoshi Mizusawa, Yamato; Shinichi Hara, Saitama-ken, all of Japan

[73] Assignee: Canon Kabushiki Kaisha, Tokyo, Japan

[21] Appl. No.: 09/108,373

[22] Filed: Jul. 1, 1998

[30] Foreign Application Priority Data

Jul. 2, 1997 [JP] Japan ................................... 9-177165
Jul. 2, 1997 [JP] Japan ................................... 9-177166

[51] Int. Cl.$^7$ .................................................. G21K 5/00
[52] U.S. Cl. .................................. 378/34; 378/84; 378/85
[58] Field of Search .................................. 378/34, 84, 85

[56] References Cited

U.S. PATENT DOCUMENTS

| | | | |
|---|---|---|---|
| 5,031,199 | 7/1991 | Cole, III et al. ........................... | 378/34 |
| 5,123,036 | 6/1992 | Uno et al. .................................. | 378/34 |
| 5,125,014 | 6/1992 | Watanabe et al. ........................ | 378/34 |
| 5,214,685 | 5/1993 | Howells ..................................... | 378/34 |
| 5,249,215 | 9/1993 | Shimano .................................... | 378/34 |
| 5,285,488 | 2/1994 | Watanabe et al. ........................ | 378/34 |
| 5,305,364 | 4/1994 | Mochiji et al. ............................ | 378/34 |
| 5,371,774 | 12/1994 | Cerrina et al. ............................ | 378/34 |
| 5,394,451 | 2/1995 | Miyake et al. ............................ | 378/34 |
| 5,444,753 | 8/1995 | Hayashida et al. ....................... | 378/35 |
| 5,448,612 | 9/1995 | Kasumi et al. ............................ | 378/84 |
| 5,512,759 | 4/1996 | Sweatt ................................... | 250/492.1 |
| 5,606,586 | 2/1997 | Amemiya et al. ........................ | 378/34 |
| 5,835,560 | 11/1998 | Amemiya et al. ........................ | 378/34 |
| 5,949,844 | 9/1999 | Wantanabe ................................ | 378/34 |
| 5,995,582 | 11/1999 | Terashima et al. ....................... | 378/34 |
| 6,014,421 | 1/2000 | Chiba et al. ............................... | 378/34 |
| 6,081,581 | 6/2000 | Hasegawa ................................. | 378/145 |

FOREIGN PATENT DOCUMENTS 63-36483 2/1988 Japan .
1-244400 9/1989 Japan .

OTHER PUBLICATIONS

R.P. Haelbich, et al., "Design Performance of an X–ray Lithography Beam Line at a Storage Ring," *J. Vac. Sci. & Technol.*, Oct.–Dec. 1983, pp. 1262–1266.

W.D. Grobman, "Synchrotron Radiation X–ray Lithography," *Handbook on Synchrotron Radiation*, vol. 1, Chap. 13, pp. 1134–1136, North–Holland Publishing Co., 1983.

Y. Watanabe, et al., "Novel Illumination System of SR Stepper with Full Field Exposure Method", The 41st International Conference on Electron, Ion and Photon Beam Technology and Nanofabrication, Abstract Book, May 27–May 30, 1997, Dana Point, CA, pp. 30–31.

*Primary Examiner*—David P. Porta
*Assistant Examiner*—Allen C. Ho
*Attorney, Agent, or Firm*—Fitzparick, Cella, Harper & Scinto

[57] ABSTRACT

An apparatus for transferring a pattern of a mask onto a substrate with radiation light from a synchrotron radiation light source, includes a first mirror for collectively reflecting radiation light from the synchrotron radiation light source, and a second mirror for reflecting radiation light from the first mirror and for projecting the same to the mask. When a light ray advancing from a light emission point of the light source toward a center of a predetermined region of the mask, to be transferred to the substrate, is taken as a chief ray, when a normal to each of the first and second mirrors at an incidence position of a corresponding chief ray is taken as a Z axis, when a direction perpendicular to a plane defined by the Z axis of each mirror and a corresponding chief ray is taken as an X axis, and when a Y axis is taken along a direction perpendicular to the Z axis and X axis of each mirror, the first mirror has a reflection surface of a shape which is concave with respect to the X axis direction and concave with respect to the Y axis direction, while the second mirror has a reflection surface of a shape which is convex with respect to the Y axis direction.

16 Claims, 11 Drawing Sheets

EXPOSURE APPARATUS FOR SYNCHROTRON RADIATION LITHOGRAPHY

FIELD OF THE INVENTION AND RELATED ART

This invention relates to an exposure apparatus and, more particularly, to an exposure apparatus of the type that radiation light from a light source such as a synchrotron radiation (SR) light source, for example, is projected by way of a mirror and a pattern of a mask is lithographically transferred to a wafer.

A synchrotron radiation light source comprises a radiation light source which produces a sheet-like electromagnetic wave (containing X-rays and vacuum ultraviolet rays) having a large divergence angle with respect to a direction along the orbital plane of the synchrotron radiation (hereinafter "horizontal direction" since the synchrotron radiation orbital plane is generally set in registration with the horizontal plane) and having a small divergence angle with respect to a direction perpendicular to the synchrotron radiation orbital plane (hereinafter "vertical direction"). Since the divergence angle along the vertical direction is small, if the radiation light is projected directly, only a small range can be illuminated with respect to the vertical direction. In consideration of this, in exposure apparatuses using synchrotron radiation light, some measure is required to expand the area to be exposed with X-rays from the synchrotron radiation light source with respect to the vertical direction.

Examples are as follows:

(1) A glancing incidence mirror is disposed between the synchrotron radiation light source and the surface to be exposed, and the mirror is oscillated with an angle of a few mrad (R. P. Haelbich, et al., "J. Vac. Sci. & Technol. B1(4), October–December", 1983, p. 1262–1266).

(2) A glancing incidence mirror with a curved surface shape is disposed between the synchrotron radiation light and the surface to be exposed, and through the reflection by the mirror curved surface the divergence angle of an X-ray beam in the vertical direction is enlarged (Warren D. Grobman, "Handbook on Synchrotron Radiation", Vol. 1, chap. 13, p. 1135, North-Holland Publishing Co., 1983).

(3) As an improvement to example (2), the mirror shape is shifted from a cylindrical shape so that the curvature at the peripheral portion reduces continuously, by which the divergence angle of an X-ray beam in the vertical direction is enlarged while attaining uniformization of intensity (Japanese Laid-Open Patent Application, Laid-Open No. 244400/1989).

FIG. 1 is a schematic and perspective view of an exposure apparatus according to example (3). Denoted at 130 is a light emission point, and denoted at 132 is a mirror. Denoted at 139 is a mask. The divergence angle of synchrotron radiation light from the emission point 130 is expanded by the mirror 132 with a specific shape, and the light is projected on the mask 139. A pattern formed on this mask is lithographically transferred to a wafer substrate, not shown.

Among examples (1)–(3) described above, in example (1), an illumination region narrower than the region to be exposed is scanned, upon the mask surface, so that at respective moments only a portion of the exposure region is illuminated. This causes a local thermal expansion of the exposure mask and wafer. The effect of such thermal expansion cannot be eliminated unless the oscillation period of the mirror is sufficiently short, and thus, accurate transfer of a fine pattern is difficult to accomplish. On the other hand, in order to shorten the oscillation period sufficiently, a large driving power is necessary, which is practically difficult to attain. Additionally, there is a loss of time at acceleration and deceleration, which causes reduced throughput.

As compared therewith, in example (2), since a required illumination region can be irradiated at once, the inconveniences involved in example (1) may be removed. However, in the document mentioned above, the mirror shape is cylindrical. This leads to that, for a uniform irradiation intensity, the beam should be expanded sufficiently. As a result, there arises a large loss of energy. On the other hand, if the irradiation intensity is not reduced, the irradiation intensity becomes non-uniform over the required exposure region, such that the use of a supplemental exposure amount control mechanism is necessary (although it is not mentioned in that document). Further, the large divergence angle of a sheet-like electromagnetic wave in the horizontal direction cannot be collected. This results in that only the angle defined from the light emission point to the exposure region can be used.

Example (3) may solve the problem of energy loss by beam expansion and the problem of non-uniform irradiation intensity within the required exposure region, among the inconveniences involved in example (2). However, only the angle defined from the emission point to the exposure region is usable in this example, like example (2). As a result, although the intensity as projected to the exposure region may be improved largely as compared with example (2), there is a necessity of the use of some measure for increasing the light source intensity or increasing the sensitivity of a resist, to thereby improve the exposure throughput. This causes an increase of cost of the synchrotron radiation light source, an increase of size of the synchrotron radiation light source, or an increase of cost resulting from preparing a special resist.

On the other hand, for the collection of a large divergence angle of a sheet-like electromagnetic wave in the horizontal direction, as an improvement to example (1), there is an example wherein a glancing incidence mirror is formed with a concave surface curvature in a direction (x direction) perpendicular to the optical axis of the synchrotron radiation light to define an illumination region of a narrower width in the vertical direction than the region on the mask to be exposed, while collecting the synchrotron radiation light, and wherein the mirror is oscillated with an angle of a few mrad to oscillate the narrow illumination region along the mask and in the vertical direction, by which the illumination region is substantially expanded. However, at moments, only a portion of the exposure region is irradiated with the beam. Thus, without sufficiently shortening the mirror oscillation period, accurate transfer of a fine pattern is difficult to accomplish, like example (1).

SUMMARY OF THE INVENTION

It is an object of the present invention to provide an exposure apparatus by which a large divergence angle of a sheet-like electromagnetic wave of synchrotron radiation light in the horizontal direction is collected so that, without enlargement of the light source intensity, the intensity projected on a required surface to be exposed can be enlarged, and by which the surface to be exposed can be irradiated at once with a substantially uniform intensity to assure accurate transfer of a fine pattern as well as improved throughput.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2A and 2B are schematic views, respectively, for explaining the structure and disposition of an optical system of an exposure apparatus according to a first embodiment of the present invention, wherein FIG. 2A is a side view and FIG. 2B is a top plan view.

FIGS. 6A and 6B are three-dimensional graphs, respectively, each for explaining the shape of a mirror used in an embodiment of the present invention, wherein FIG. 6A shows a first mirror and FIG. 6B shows a second mirror.

FIGS. 12A–12C are schematic views, respectively, for explaining fine oscillation in an embodiment of the present invention, wherein FIG. 12A shows irradiation intensity on a mask surface before a fine scan of a mirror, FIG. 12B shows a shift of irradiation intensity non-uniformness upon the mask surface with a mirror fine scan, and FIG. 12C shows irradiation intensity upon the mask surface after the mirror fine scan.

DESCRIPTION OF THE PREFERRED EMBODIMENTS

Figure 1:
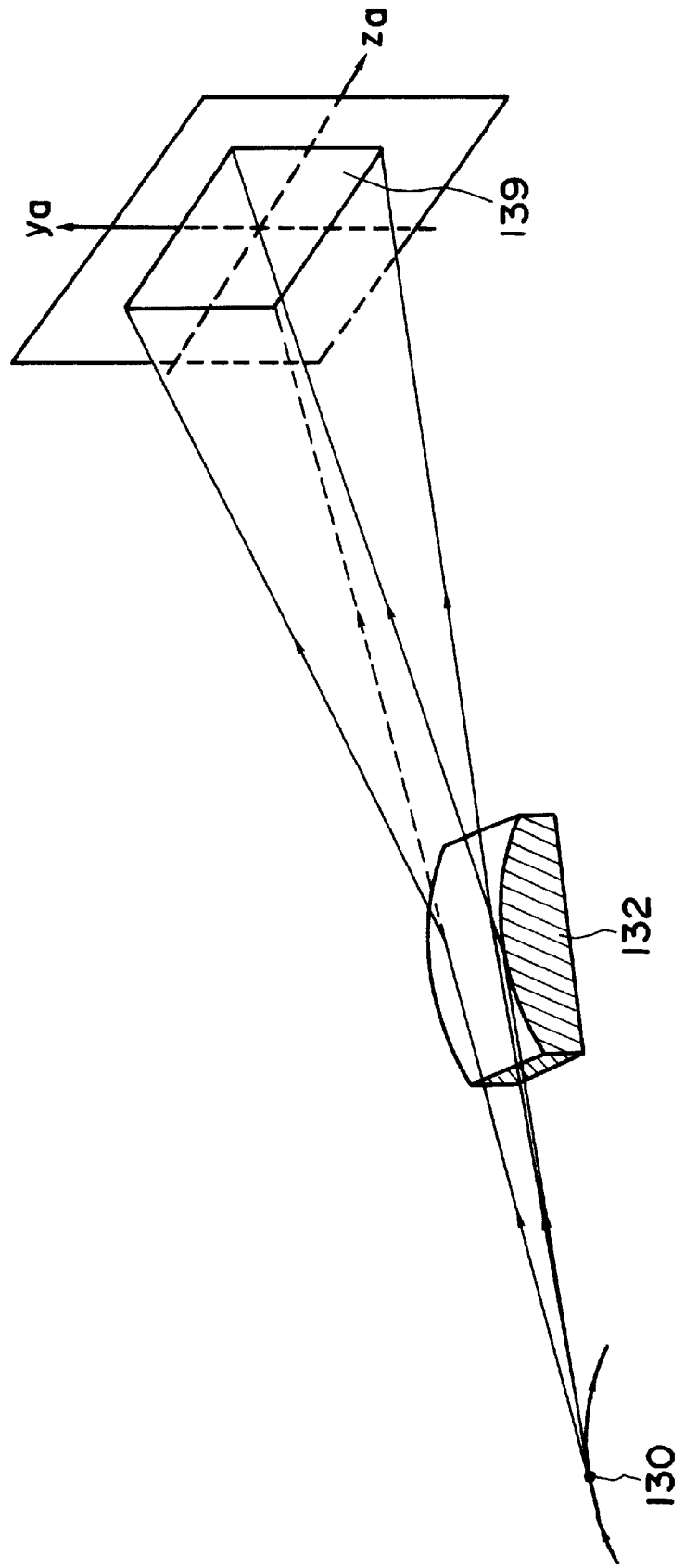
FIG. 1 is a schematic and perspective view of an exposure apparatus according to example (3) described above.
Figure 2A:
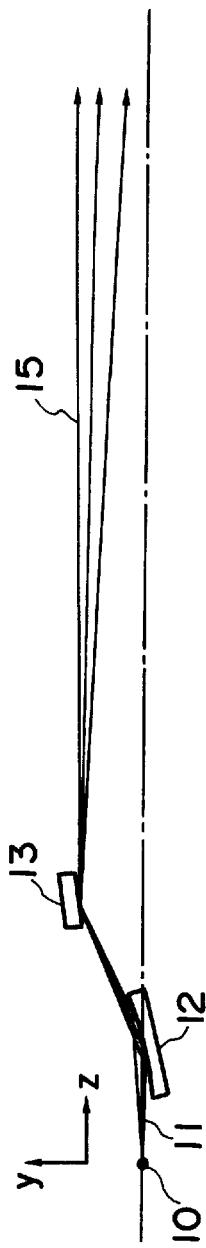
Figure 2B:
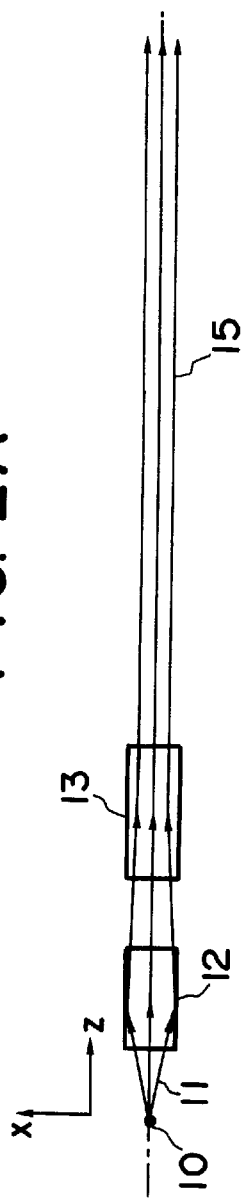

Preferred embodiments of the present invention will be described in conjunction with the drawings. FIGS. 2A and 2B are schematic views, respectively, for explaining a structure and disposition of an optical system of an exposure apparatus according to a first embodiment of the present invention, wherein FIG. 2A is a side view and FIG. 2B is a top plan view. Denoted in these drawings at 10 is a light emission point, and denoted at 11 and 15 each is synchrotron radiation light. Denoted at 12 is a first mirror and denoted at 13 is a second mirror.

In FIGS. 2A and 2B, as an electron orbit is bent at the light emission point by a bending magnet, the synchrotron radiation light 11 is emitted in a tangential direction. In this embodiment, the synchrotron radiation light 11 emitted from the emission point 10 with a large angle is reflected by the first mirror 12 and then by the second mirror 13. The synchrotron radiation light 11 as reflected by the second mirror 13 is directed to a mask (not shown).

Figure 2C:
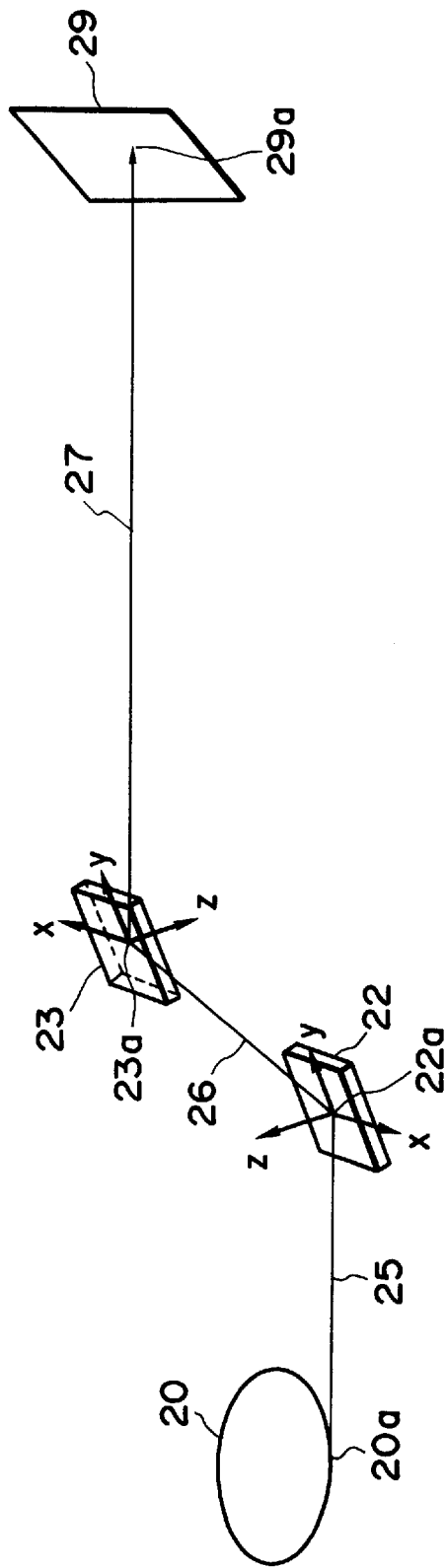
FIG. 2C is a schematic and perspective view for explaining chief rays, mirror centers and the coordinate systems, in an embodiment of the present invention.

FIG. 2C is a schematic and perspective view for explaining chief rays, mirror centers and coordinate systems in this embodiment of the present invention. Denoted in the drawing at 20 is a synchrotron radiation ring, and denoted at 20$a$ is a light emission point. Denoted at 22 is a first mirror, and denoted at 22$a$ is the center of the first mirror. Denoted at 23 is a second mirror, and denoted at 23$a$ is the center of the second mirror. Denoted at 25, 26 and 27 are chief rays. Denoted at 29 is a mask, and denoted at 29$a$ is the center of the mask. Downstream of the mask, there is placed a workpiece (wafer) to be exposed (not shown) onto which a pattern of the mask is to be transferred by exposure.

Synchrotron radiation (SR) light is emitted from the emission point 20$a$ of the synchrotron radiation (SR) ring 20 which is a light source of radiation light such as X-rays or vacuum ultraviolet rays, with a wide angle of a few tens of mrad in the horizontal direction and with a small angle of about one mrad in the vertical direction. The synchrotron radiation light is reflected by the first and second mirrors 22 and 23 successively, and it is projected to a region (irradiation region) of the mask 29, including a region (exposure region) onto which a pattern formed on the mask 29 is to be transferred. Of the synchrotron radiation light emitted from the emission point while being diverged in the horizontal and vertical directions, those synchrotron radiation rays which impinge on the center 29$a$ of the mask 29 are called chief rays 25, 26 and 27. The point where the chief ray 25 is reflected by the first mirror 22 is called a center 22$a$ of the first mirror. The point where the chief ray 26 is reflected by the second mirror 23 is called a center 23$a$ of the second mirror. A normal to the mirror at its center 22$a$ or 23$a$ is taken as the Z axis. The direction extending outwardly from the mirror is taken as a positive direction along the Z axis. An axis perpendicular to a plane defined by the chief ray, impinging on the mirror, and the Z axis of the mirror is taken as the X axis of that mirror. An axis perpendicular to both the X axis and the Z axis of the mirror is taken as the Y axis. The direction along the Y axis of the mirror, in which the inner product with the vector of the chief ray in its advancement direction, being emitted from the mirror, is taken as a positive direction. In order that in the positive X axis direction of the mirror the X, Y and Z axes define a right-handed system, the direction along the X axis in which the outer product of the unit vector in the positive direction of the Z axis and the unit vector in the positive direction of the Y axis corresponds to the unit vector in the positive direction of the X axis, is taken as the positive direction.

The synchrotron radiation light comprises a sheet-like electromagnetic wave (containing X-rays and vacuum ultraviolet rays) having a large divergence angle in the horizontal direction (along the synchrotron radiation orbital plane) and a small divergence angle in the vertical direction (a direction perpendicular to the synchrotron radiation orbital plane). As regards the "synchrotron radiation light having a large divergence angle in the horizontal direction", in an exact sense, it is not emitted from a single emission point, but the light is emitted from points along the synchrotron radiation electron orbit, in tangential directions. Here, synchrotron radiation light emerging from a synchrotron radiation electron orbit of a sufficiently small length that can be regarded as a point, is taken as synchrotron radiation light emitted from a single emission point and with a divergence angle corresponding to the length of that electron orbit.

Figure 3:
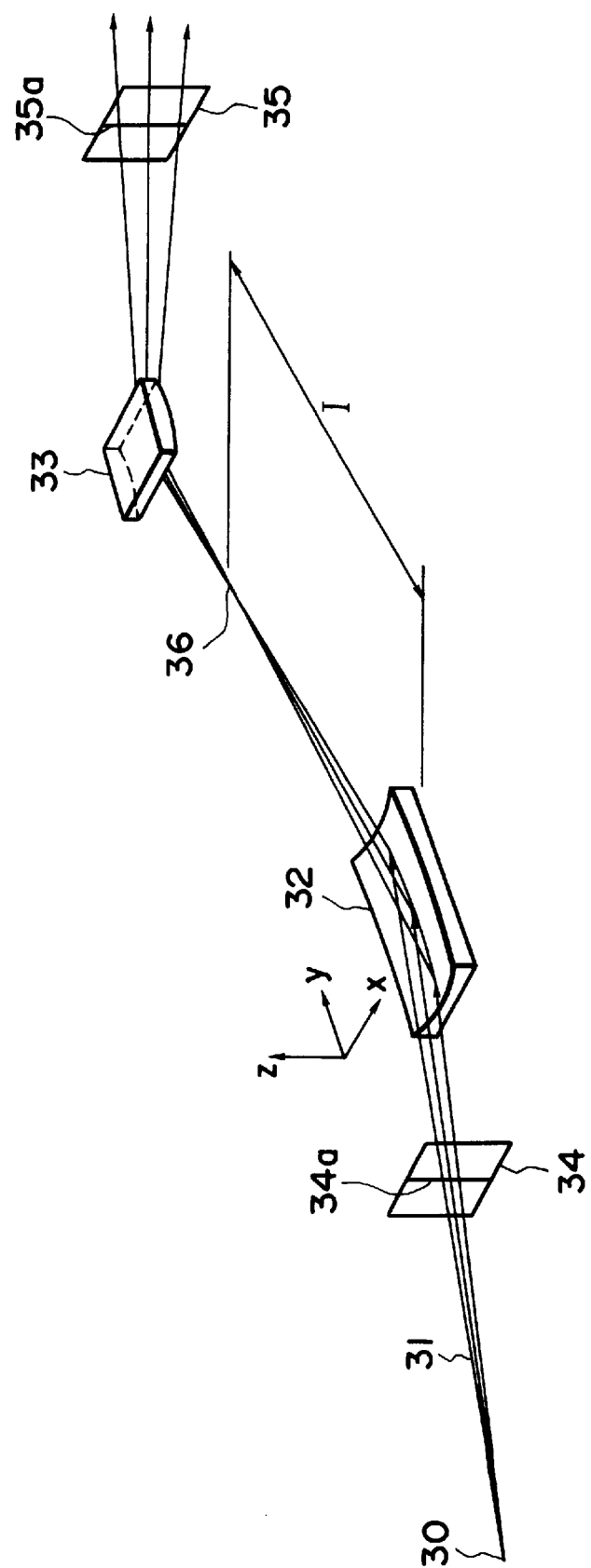
FIG. 3 is a schematic and perspective view for explaining a path of synchrotron radiation light emitted in the vertical direction, in an embodiment of the present invention.

FIG. 3 is a schematic and perspective view for explaining a path of rays of synchrotron radiation light emitted with divergence in the vertical direction, in an embodiment of the present invention. Denoted in the drawing at 30 is a light source, and denoted at 31 is synchrotron radiation light emitted in the vertical direction. Denoted at 32 is a first mirror, and denoted at 33 is a second mirror. Denoted at 34 and 35 are imaginary planes, and denoted at 34a and 35a each is an intersection line between the imaginary plane and the synchrotron radiation light emitted in the vertical direction. Denoted at 36 is the position where the light is collected or converged.

The synchrotron radiation light 31 emitted from the light source 30 in the vertical direction, with a divergence angle of about one mrad, is reflected by the first mirror 32 having a concave shape in the X axis direction and also a concave shape in the Y axis direction, as shown in FIG. 3. Particularly, because of a concave shape along the Y axis direction, the light is collected substantially at a single point which is at position 36 of a distance 1 from the first mirror. The second mirror 33 is disposed downstream of this light convergence point. The second mirror 33 has a convex shape in the Y axis direction, and it serves to further expand the synchrotron radiation, being gradually expanded from the convergence point 36, and to direct the light toward the mask. The intersection line 34a or 35a between the synchrotron radiation light emitted with divergence in the vertical direction and the imaginary plane 34, disposed between the light source 30 and the first mirror 32, or the imaginary plane 35 disposed between the second mirror 33 and the mask, extends vertically.

Figure 4:
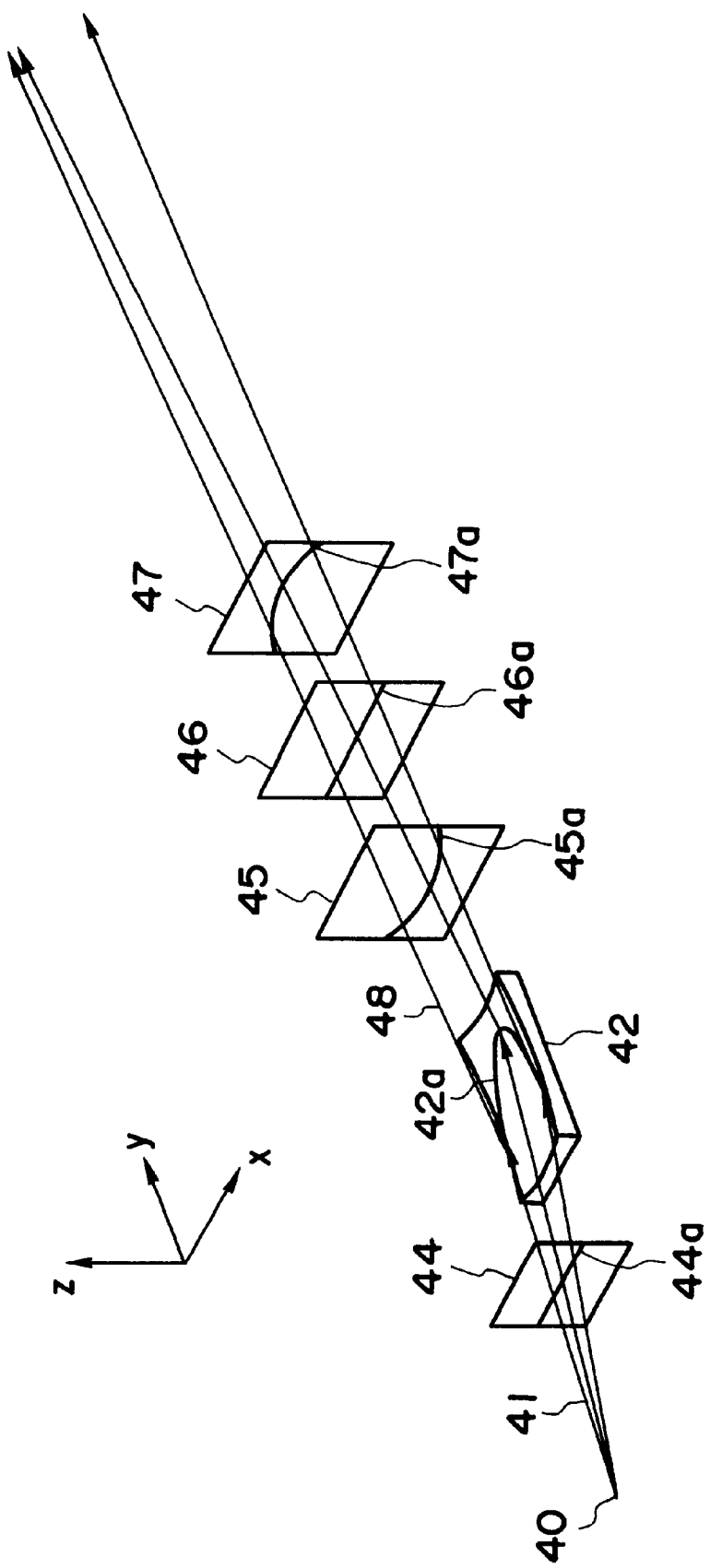
FIG. 4 is a schematic and perspective view for explaining a path of synchrotron radiation light emitted in the horizontal direction, in an embodiment of the present invention.

FIG. 4 is a schematic and perspective view for explaining a path of rays of synchrotron radiation light emitted with divergence in the horizontal direction, in an embodiment of the present invention. Denoted in the drawing at 40 is a light source, and denoted at 41 is synchrotron radiation light emitted in the horizontal direction. Denoted at 42 is a first mirror, and denoted at 42a is an intersection line between the first mirror and the synchrotron radiation light emitted in the horizontal direction. Denoted at 44, 45, 46 and 47 are imaginary planes, and denoted at 44a, 45a, 46a and 47a are intersection lines between the synchrotron radiation light and the imaginary planes, respectively. Denoted at 48 is synchrotron radiation light emitted from the first mirror.

As shown in FIG. 4, the synchrotron radiation light 41 emitted from the light source 40 with a divergence angle of about a few tens mrad in the horizontal direction impinges on the first mirror 42 which has a concave shape in the X axis direction and also a concave shape in the Y axis direction. The intersection line 44a between the synchrotron radiation light emitted in the horizontal direction and the imaginary plane 44, perpendicular to that (chief ray) of the synchrotron radiation light which is going to impinge on the center of the mask, extends straight. The intersection line 42a between the first mirror 42 and the synchrotron radiation light 41 emitted with divergence in the horizontal direction is like a parabolic line, because the first mirror 42 is mainly concave along the X axis direction. As regards the intersection between the synchrotron radiation light 48 from the first mirror 42 and the imaginary plane perpendicular to the chief ray, the intersection line 45a upon the imaginary plane 45 just after the first mirror 1 is concave like the orientation of the concave surface of the first mirror 42 along the X axis direction (in FIG. 4, the concave surface faces up). On the other hand, because the first mirror 42 is concave along the Y axis direction, the intersection line 46a with the imaginary plane 46 becomes straight as spaced from the first mirror 42. As it is spaced more, the intersection line 47a with the imaginary plane 47 becomes convex.

The second mirror is disposed remote from the light source more than the position 33 where the rays of synchrotron radiation light emitted with divergence in the vertical direction (FIG. 3) are collected substantially at one point, and also it is set closer to the light source as compared with the point 46 where the intersection line between the synchrotron radiation light 41 emitted with divergence in the horizontal direction and the imaginary plane perpendicular to the chief ray becomes straight. With this arrangement, at the second mirror position, the synchrotron radiation light is substantially collected in the vertical direction and, additionally, the light in the horizontal direction becomes substantially straight. As a result of this, at the position as being projected on the second mirror, the width of the synchrotron radiation light with respect to the projection direction becomes sufficiently small. Thus, even if the second mirror has a small length in the incidence direction, all the incident light can be reflected thereby. Namely, without a decrease of synchrotron radiation light utilization efficiency, the size of the second mirror can be reduced sufficiently.

Further, since the second mirror position is set closer to the light source as compared with the position 46 where the intersection line between the synchrotron radiation light 41, emitted with divergence in the horizontal direction, and the imaginary plane perpendicular to the light impinging on the mask center becomes straight, the use of a second mirror with a convex shape in the Y direction enables that the point where the intersection line between the synchrotron radiation light reflected by that convex surface mirror and the imaginary plane perpendicular to the light impinging on the mask center becomes straight is placed more remote as compared with the position 46 to be established without the convex surface mirror. This will be readily understood from that, when light being converged passes through a convex lens, it is collected at a distance larger than the distance to be defined without the concave lens.

Figure 5:
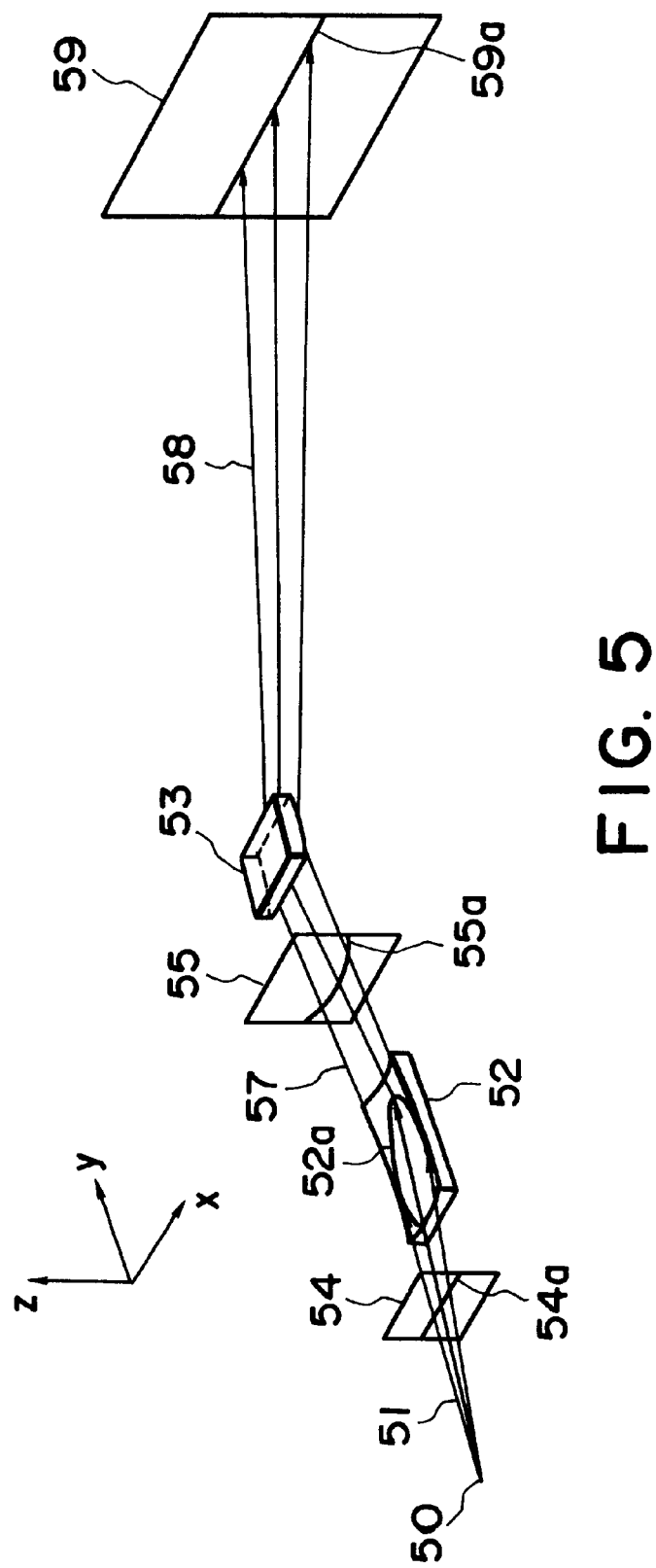
FIG. 5 is a schematic and perspective view for explaining a path of synchrotron radiation light emitted in the horizontal direction, as well as a distribution thereof upon a mask surface, in an embodiment of the present invention.

FIG. 5 is a schematic and perspective view for explaining a path of synchrotron radiation light emitted in the horizontal direction as well as a distribution upon a mask surface, in an embodiment of the present invention. Denoted in the drawing at 50 is a light source, and denoted at 51 is synchrotron radiation light emitted in the horizontal direction. Denoted at 52 is a first mirror, and denoted at 52a is an intersection line between the first mirror and the synchrotron radiation light emitted in the horizontal direction. Denoted at 53 is a second mirror, and denoted at 54 and 55 are imaginary planes. Denoted at 54a and 55a are intersection lines between the synchrotron radiation and the imaginary planes. Denoted at 57 is synchrotron radiation light emitted from the first mirror, and denoted at 58 is synchrotron radiation light emitted from the second mirror. Denoted at 59 is a mask surface, and denoted at 59a is the point of intersection between the mask surface and the synchrotron radiation light from the second mirror.

The curvature radius of convexity of the second mirror 53 in the Y direction may be set appropriately, by which, as shown in FIG. 5, after the synchrotron radiation light 51 emitted from the light source 50 with divergence in the horizontal direction is reflected by the first and second mirrors 52 and 53 successively, the intersection line 59a upon the mask surface 59 or wafer surface can be made straight.

In the synchrotron radiation light, the light being emitted with divergence in the horizontal direction has a largest light intensity. The intensity decreases with a shift toward the vertical direction. Thus, the phenomenon that the synchrotron radiation light emitted in the horizontal direction becomes straight upon the mask means that the light of largest intensity becomes straight and, therefore, that the intensity distribution of synchrotron radiation light upon the mask becomes uniform with respect to the horizontal direction. This enable easy control of the exposure amount in a system wherein the exposure amount is controlled by use of a shutter which can be moved one-dimensionally.

If the synchrotron radiation light 51 emitted from the light source 50 in the horizontal direction and sequentially reflected by the first and second mirrors 52 and 53 does not become straight upon the mask surface 59 or wafer surface, the intensity distribution on the mask or wafer becomes two-dimensional and, therefore, the exposure amount control is difficult to attain. In a system wherein an irradiation region of a width smaller than the exposure region is scanned in a direction expanding that narrow width to assure a required exposure region, that is, in a scan exposure system, even if there is a small intensity distribution, it is averaged with the scan operation and the effect thereof is relatively small. However, in a system wherein the whole exposure region is exposed at once with substantially uniform light, that is, in a simultaneous exposure system, if its intensity distribution is two-dimensional, control of the exposure amount is quite difficult.

Next, specific numerical examples of the present invention will be described.

In FIGS. 2A and 2B, the distance $L_1$ between the emission point 20a and the center 22a of the first mirror may be $l_1$=2800 mm, the distance $l_2$ between the center 22a of the first mirror and the center 23a of the second mirror may be $l_2$=3200 mm. The distance $l_3$ between the center 23a of the second mirror and the mask 29 may be $l_3$=5000 mm, and the oblique incidence angle θ to the first and second mirrors 22 and 23 may be θ=18 mrad. At a distance 4500 mm from the second mirror 23 toward the mask, there may be a vacuum partition of Be film, of a thickness 18 microns. The mask side of the vacuum partition may be filled with He, with a pressure of 150 Torr. The mask 29 may comprise a SiC membrane of 2 micron thickness on which a pattern of an absorptive material, mainly composed of tungsten, may be formed. At a gap of 20 microns from the mask membrane, there may be a wafer.

While in this embodiment the distance $l_3$ between the center 23a of the second mirror and the mask 29 may be $l_3$=5000 mm, preferably, it may be not less than 1000 mm. In regard to the Z direction, the synchrotron radiation light diverges substantially from the second mirror position and reaches the mask. Generally, the setting precision of the mask-to-wafer gap is about ±2 microns. However, since the synchrotron radiation light is diverged, with a shift of the gap between the mask and the wafer, the position of the mask pattern transferred onto the wafer displaces. This leads to degradation of alignment precision of the exposure apparatus. The tolerance for a decrease of the alignment precision to be caused by a change in the mask-to-wafer gap is only ±10 nm. Therefore, divergence of the synchrotron radiation light has to be not greater than 5 mrad with 10 nm/2 micron. Since the exposure region has, at the smallest, a side having a length of 10 mm, the distance from the center to the periphery is 5 mm. In order that the divergence of the synchrotron radiation light is not greater than 5 mrad, the distance between the second mirror and the mask should be not less than 1000 mm with 5 mm/5 mrad.

Figure 6A:
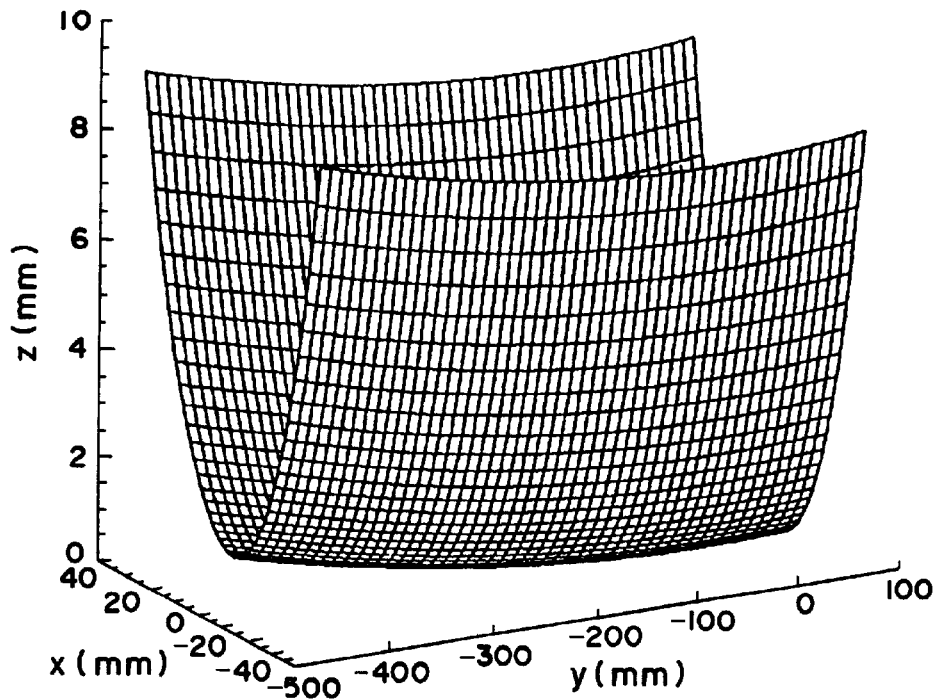
Figure 6B:
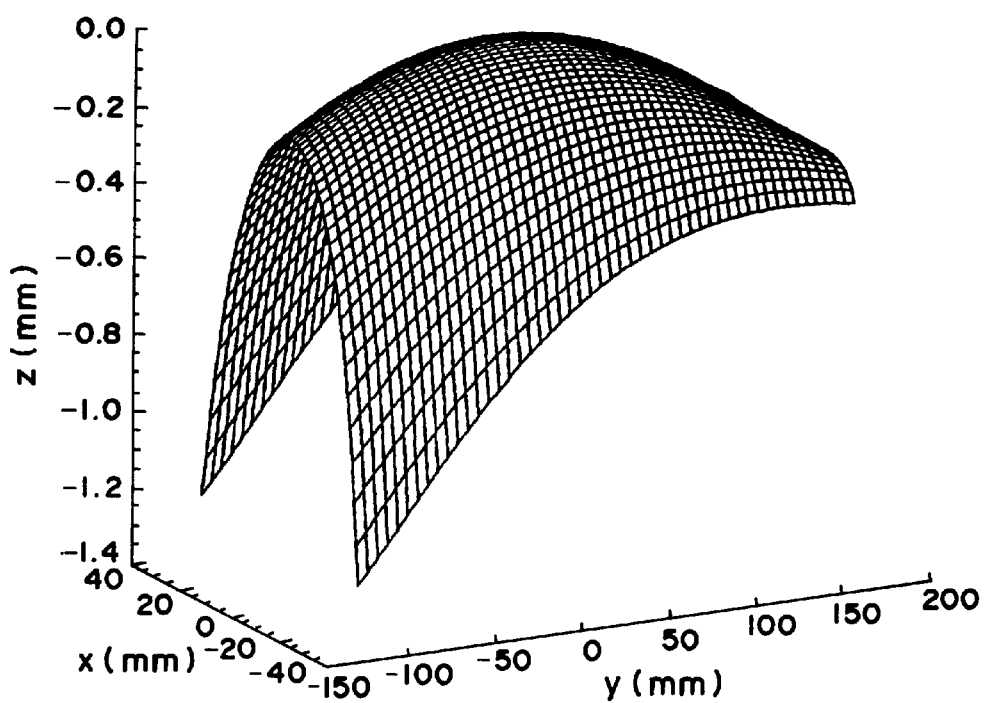

The first mirror 22 may have a shape of concave in the X axis direction and concave in the Y axis direction. In the neighborhood of its center, the X direction curvature radius may be $r_x$=89.9 (mm)–0.0062 y (mm), and the Y direction curvature radius may be $r_y$=82284 mm. Since the curvature radius $r_x$ varies in the Y direction, the curvature radius of the mirror in the neighborhood of its center becomes gradually smaller in the direction away from the light emission point. The second mirror has particularly a convex shape in the Y axis direction, and the curvature radius in the X direction may be 1332 mm and the curvature radius in the Y direction may be 34800 mm. FIGS. 6A and 6B show examples of mirror shapes according to this embodiment of the present invention. FIGS. 6A and 6B illustrate three-dimensional shapes of mirrors of the embodiment, wherein FIG. 6A relates to the first mirror and FIG. 6B relates to the second mirror.

In this embodiment, the curvature radius $r_x$ of the first mirror, in the X axis direction, in the neighborhood of its center may be 89.9 mm–0.0062 y (mm) while the curvature radius $r_y$ in the Y axis direction may be 82284 mm. That is, there is a relation $|r_x|<|r_y|$. The effect of changing, in the X direction, the light ray advancing in the Y direction is dependent upon the curvature of the mirror in the X direction, while the effect of changing, in the Z direction, the light ray advancing in the Y direction is dependent on the curvature of the mirror in the Y direction. Comparing the effect of changing the Y direction advancing light ray in the X direction and the effect of changing it in the Z direction by use of the same X direction curvature radius and Y direction curvature radius, the force of changing it in the Z direction is larger. Thus, when the relation between the X axis direction curvature radius $r_x$ and the Y axis direction curvature radius $r_y$ of the first mirror, in the neighborhood of its center, are set to satisfy $|r_x|<|r_y|$, a change in the X and Z directions can be approximated.

The synchrotron radiation light emitted with divergence in the vertical direction is reflected by the first mirror 32, as shown in FIG. 3, and it may be collected at a position 1=1007 mm from the center of the first mirror. Since the distance $l_2$ from the first mirror 32 to the second mirror 33 may be $l_2$=3200 mm, the distance from the convergence point 36 to the second mirror 33 may be equal to 2193 mm. From an analogous relation, the width in a direction perpendicular to the light in the neighborhood of the second mirror 33 may be 2193/1007 as compared with the width in the neighborhood of the first mirror 32, such that the width may be about 2.18 times. This means that, if the light impinging on the first mirror advances without being reflected by the first mirror, the width may become 6000/2800=2.14 times larger and, therefore, that the width of the synchrotron radiation light at the second mirror position is not particularly enlarged as compared with a case without the first mirror.

The position of the imaginary plane 46 with which the intersection line between the synchrotron radiation light 41 emitted with divergence in the horizontal direction and the imaginary plane perpendicular to the light impinging on the mask center become straight, may be placed at a distance 3560 mm from the center of the first mirror 42 in the case without a second mirror. Thus, the second mirror position is at the light source side of that position and, additionally, it is very close to that position. The size of the second mirror can be reduced as a consequence.

Figure 7:
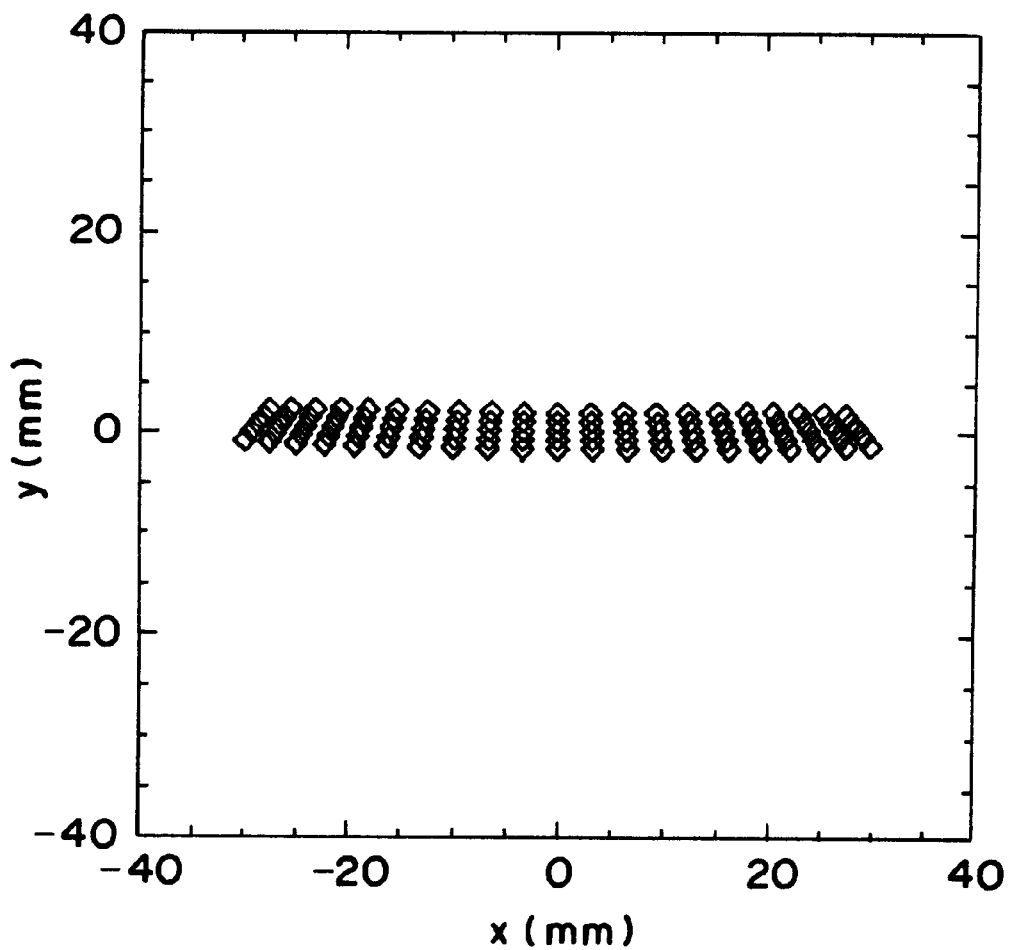
FIG. 7 is a graph for explaining in a plan view a distribution of reflection light from the first mirror, at the central position of the second mirror, in an embodiment of the present invention.

FIG. 7 shows a distribution of reflection light from the first mirror, at the center position of the second mirror. FIG. 7 is a plan view showing a distribution of reflection light from the first mirror, at the center position of the second mirror, in an embodiment of the present invention. More specifically, FIG. 7 illustrates a distribution of light rays at the center position of the second mirror, as light rays of a number 105 are emitted from the light source in an angular range of −13.5 mrad to 13.5 mrad and at intervals of 1.35 mrad with respect to the X direction and in a range of −0.28 mrad to 0.28 mrad and at intervals of 0.14 mrad with respect to the Y direction.

Since the intersection line between the first mirror and the synchrotron radiation light emitted along the orbital plane is parabolic such as depicted at the intersection line 42a of the first mirror of FIG. 4, irrespective that the effective region of the first mirror 42 requires a length of 540 mm, the length of the effective region of the second mirror may be only about 280 mm. In order to prevent deterioration of the shape during mirror work or deterioration of the shape due to deformation caused by a pressing force, for example, at least the mirror should have a thickness on an order proportional to the length of the mirror. In regard to the widthwise direction, the first and second mirrors are substantially the same. Thus, the second mirror may have a weight of about 1/3.7 of the first mirror. If the arrangement according to this embodiment of the present invention is not used, the second mirror will have a length like that of the first mirror. It can be said, therefore, that the weight of the second mirror is reduced to about 1/4. Since the mirror size can be decreased, the work precision for the second mirror can be improved. In addition, as required, the second mirror can be finely oscillated so as to reduce non-uniformness of the intensity attributable to work error of the first mirror or to work error of the X-ray window, for example.

Figure 8:
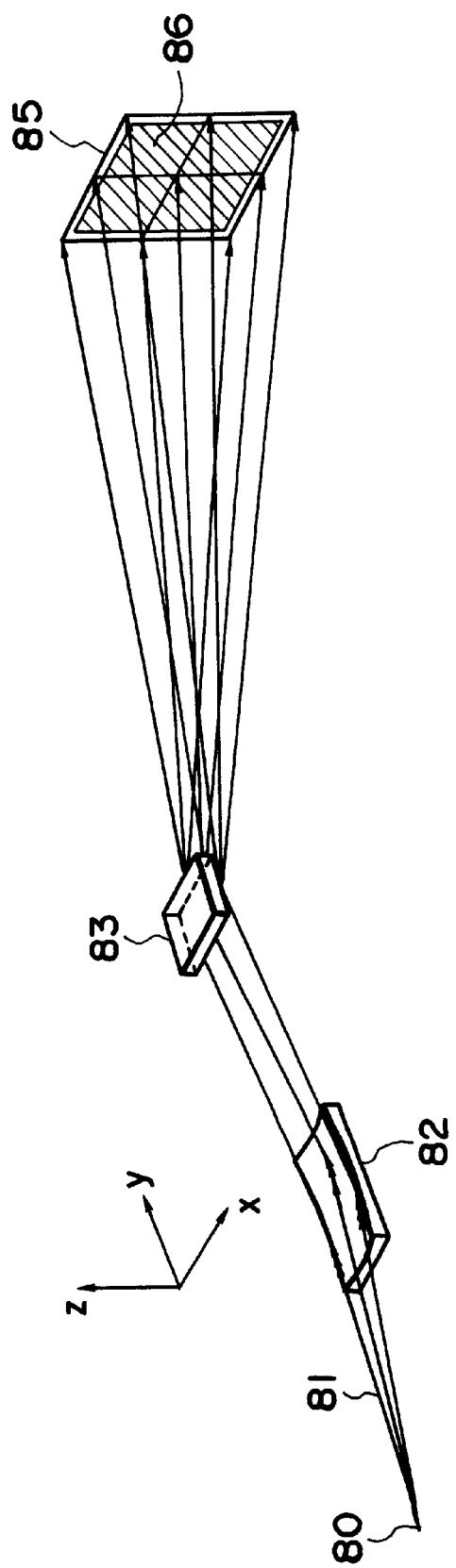
FIG. 8 is a schematic and perspective view for explaining an irradiation region and an exposure region defined on a mask by synchrotron radiation light, in an embodiment of the present invention.

FIG. 8 is a schematic and perspective view for explaining an irradiation region to be defined by synchrotron radiation light upon a mask and an exposure region, in an embodiment of the present invention. Denoted in the drawing at 80 is a light source, and denoted at 81 is synchrotron radiation light. Denoted at 82 is a first mirror, and denoted at 83 is a second mirror. Denoted at 85 is an irradiation region on a mask, and denoted at 86 is an exposure region on the mask, which is depicted with hatching.

In this embodiment, the exposure region 86 may have a size of 50 mm square as required by the 4G DRAM generation. The synchrotron radiation light reflected by the second mirror illuminates the irradiation region 85 which may have a size of about 60 mm square, on the mask.

As shown in FIG. 5, if the synchrotron radiation light 51 emitted with divergence in the horizontal direction is reflected only by the first mirror 52, the intersection line with a plane perpendicular to the chief ray will become straight at a position of 3560 mm after the first mirror 52. However, with the provision of the second mirror 53 of an X direction curvature radius of 1332 mm and a Y direction curvature radius of 34800 mm at a side of this plane facing the light source 50, the synchrotron radiation light 51 reflected by the second mirror 53 and emitted in the horizontal direction can define a substantially straight intersection line 59a upon the mask surface 59.

Figure 9:
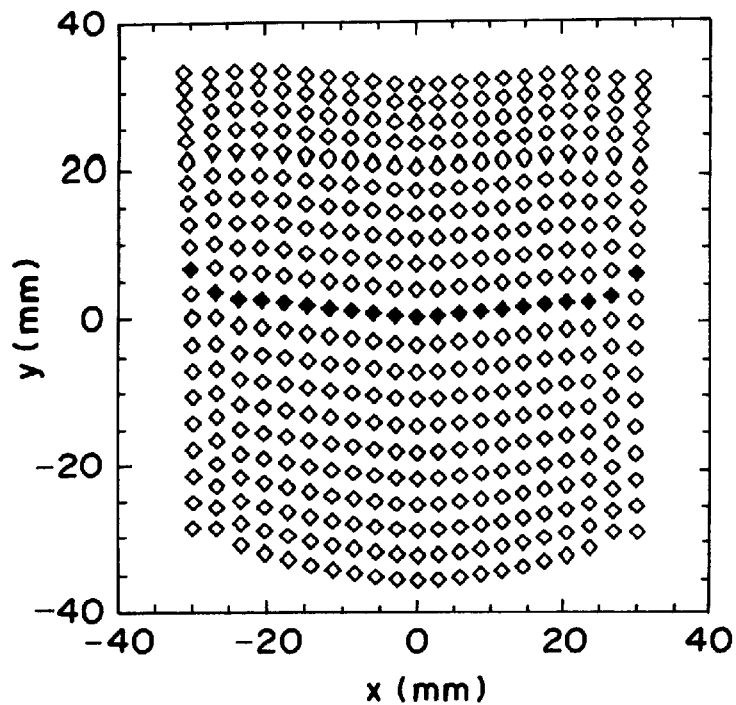
FIG. 9 s a graph for explaining in a plan view a distribution of light rays at the mask position, in an embodiment of the present invention.

FIG. 9 is a plan view showing a distribution of light rays at the mask position, in an embodiment of the present invention. Specifically, it illustrates a distribution of light rays at the mask position, in a case wherein light rays of a number 441 in total are emitted from a light source in an angular range of −13.5 mrad to 13.5 mrad and at intervals of 1.35 mrad with respect to the X direction and in an angular range of −0.28 mrad to 0.28 mrad and at intervals of 0.028 mrad. The painted squares depict positions where light rays impinge as the Y direction emission angle is zero. It is seen that also in this embodiment, it is substantially straight.

If the synchrotron radiation light 51 emitted from the light source 50 in the horizontal direction and sequentially reflected by the first and second mirrors 52 and 53 does not become straight upon the mask surface 59 or wafer surface, the intensity distribution on the mask or wafer becomes two-dimensional and, therefore, the exposure amount control is difficult to attain. In a scan exposure system, as described, even if there is a small intensity distribution, it is averaged with the scan operation and the effect thereof is relatively small. However, in a simultaneous exposure system, if its intensity distribution is two-dimensional, control of the exposure amount is quite difficult.

Figure 10:
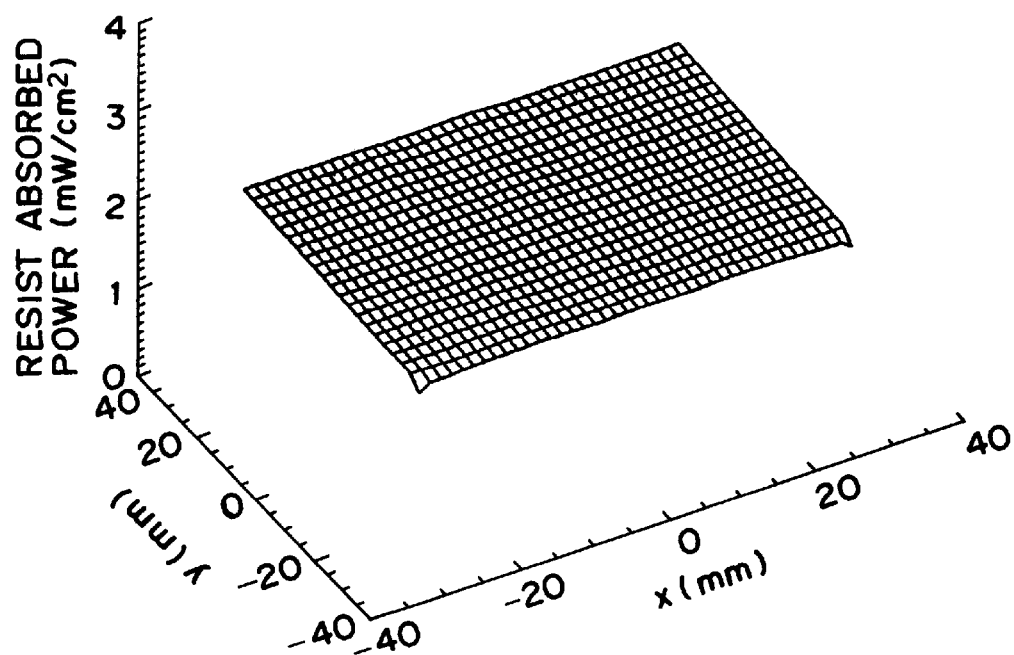
FIG. 10 is a graph for explaining in a perspective view the power as absorbed by a resist, in an embodiment of the present invention.

FIG. 10 is a three-dimensional graph, showing power as absorbed by a resist, in an embodiment of the present invention. With a region of about 60 mm square, the resist absorbed power can be made substantially uniform.

Here, assuming that the distance from the light emission point to the center of the first mirror is $l_1$, the distance from the center of the first mirror to the center of the second mirror is $l_2$, the distance from the center of the second mirror to the mask is $l_3$, the glancing incidence angle to the first and second mirrors (i.e., the angle of an incident ray as measured with respect to the mirror surface, in the neighborhood of the mirror center) is $\theta$, and the X direction and Y direction curvature radii of the first mirror near the center thereof are $r_{1x}$ and $r_{1y}$, respectively, then the focal lengths $f_{1x}$ and $f_{1y}$ of the first mirror near its center can be expressed by:

$$f_{1x} = r_{1x}/(2 \sin \theta)$$

$$f_{1y} = r_{1y} \sin \theta / 2$$

The light rays emitted from the light emission point with divergence in a direction perpendicular to the synchrotron radiation orbital plane are diverged with small expansion. If the angle that represents the expansion is denoted by $\delta$, without the first mirror, the light is expanded at the center position of the second mirror and in the direction perpendicular to the synchrotron radiation orbital plane by:

$$2(l_1 + l_2) \tan(\delta/2).$$

On the other hand, if there is the first mirror, it expands at the center position of the second mirror and in the direction perpendicular to the synchrotron radiation orbital plane by:

$$2l_1 \tan(\delta/2) (l_2 - b)/b.$$

Here, $$b = 1/(1/f_{1y} - 1/l_1).$$

The result of the provision of the first mirror that the light emitted in the direction perpendicular to the synchrotron radiation orbital plane expands at the second mirror position by an amount ten times or more as compared with a case without the first mirror, is not desirable because it leads to an excessive increase in the size of the mirror. For this reason, a relation:

$$2l_1 \tan(\delta/2)(l_2 - b)/b < 20(l_1 + l_2) \tan(\delta/2)$$

should be satisfied. From this, the following relation should be satisfied:

$$b > l_1 l_2 / (11 l_1 + 10 l_2).$$

Thus, $$f_{1y} > l_1 l_2 / [11(l_1 + l_2)].$$

Namely, in this embodiment, preferably the curvature radius of the first mirror in the Y direction should satisfy the following condition:

$$r_{1y} > 2 l_1 l_2 / [11(l_1 + l_2) \sin \theta] \quad (1)$$

Also, for a reduction in size of the second mirror, preferably the light is collected substantially at a single point before incidence on the second mirror, and $$b < l_2.$$

Thus, $$1/(1/f_{1y} - 1/\mathbf{l}_1) < l_2.$$

That is, $$f_{1y} < l_1 l_2 / (\mathbf{l}_1 + l_2).$$

Expressing this in terms of $r_{1y}$, in addition to the lower limit as defined by condition (1) above the following upper limit should desirably be satisfied in this embodiment:

$$r_{1y} 2 l_1 l_2 / [(l_1 + l_2) \sin \theta] \quad (2)$$

Further, the mirror has a concave curvature in the X direction for collection of synchrotron radiation light being expanded along the synchrotron radiation orbital plane. However, if due to the curvature the collected synchrotron radiation light is converged substantially at a single point on the second mirror, then the second mirror is heated and it may be deformed. Deformation of the mirror is very undesirable because it enlarges the non-uniformness of the intensity of synchrotron radiation light to be projected to the mask.

In order to prevent this, light should be converged at a position sufficiently upstream of the second mirror or sufficiently downstream of it. This can be accomplished by maintaining the expansion of light in the X direction upon the second mirror not greater than twice the expansion of light in the X direction upon the first mirror.

Therefore, the position where the light being expanded along the synchrotron radiation orbital plane is substantially collected may be set between the first and second mirrors and at a distance from the first mirror which is on the first mirror side of the 2/3 position therebetween. Alternatively, it may be placed at a distance from the second mirror which is not less than a half of the distance between the first and second mirrors.

Namely, when $$c = 1/(1/f_{1x} - 1/l_1)$$

is satisfied, a relation:

$$c < 2/3 l_2$$

or $$c > 3/2 l_2$$

should be satisfied. That is, $$f_{1x} < 1 / [1/l_1 + (3/2)/l_2]$$

or $$f_{1x} > 1 / [1/l_1 + (2/3)/l_2].$$

In this embodiment of the present invention, therefore, a condition:

$$r_{1x} < 2 \sin \theta / [1/l_1 + (3/2)/l_2]$$

or $$r_{1x} < 2 \sin \theta / [1/l_1 + (2/3)/l_2] \quad (3)$$

should preferably be satisfied.

In this embodiment, $l_1 = 2800$ mm, $l_2 = 3200$ mm, $l_3 = 5000$ mm, and $\theta = 18$ mrad. Thus, from equation (1) above, it follows that:

$$r_{1y} > 15085 \text{ mm}.$$

From equation (2), it follows that:

$$15085 \text{ mm} < r_{1y} < 165935 \text{ mm}$$

From equation (3), it follows that:

$$r_{1x} < 43.6 \text{ mm}$$

or $$r_{1x} < 63.7 \text{ mm}.$$

A specific numerical example satisfying these conditions in this embodiment, $$r_{1x} = 89.9(\text{mm}) - 0.0062 y(\text{mm})$$

$$r_{1x} = 82284 \text{ mm}$$

may be set, by which a superior X-ray illumination optical system can be provided.

In this embodiment of the present invention, if necessary, the mirror may be minutely oscillated or rotated.

Since the wavelength of light to be used in an exposure apparatus based on synchrotron radiation light is about 1 nm, as regards the shape of a mirror, substantially the same precision as that to the wavelength is required. Working operation for the mirror will be easier with a smaller size of the mirror, for the same work precision. However, the size of the first mirror will be about a few hundred millimeters and, additionally, the shape has no symmetric axis. It is, therefore, practically difficult to machine the mirror with a precision of a few nm. The intensity may be completely uniform if the mirror has an idealistic shape. Actually, however, due to mirror work error, for example, there occurs non-uniformness of intensity. Similarly, an X-ray window used in the path of projection of synchrotron radiation light and at the boundary with a vacuum region is mainly composed of a Be film. Also, in this case, there is a rolling operation during a thin film forming process and, therefore, there is a possibility of work error in the X-ray window which leads to non-uniformness of intensity.

Such work error of the mirror or X-ray window appears within the exposure region on a mask, as non-uniformness of intensity of synchrotron radiation light of a period of about several tens of microns to a few millimeters. Thus, by oscillating the mirror minutely so that the synchrotron radiation light oscillates by about 10 mm upon the mask, the non-uniformness caused by work error of the mirror or X-ray window can be reduced. In an embodiment of the present invention, since the length of the second mirror which is at a distance from the light source more spaced as compared with the first mirror can be 100–300 mm and the weight thereof can be reduced, the mirror can be oscillated minutely. Thus, it is possible to reduce non-uniform exposure which is attributable to the work error of the mirror or X-ray window, a scratch on the mirror surface, dust or foreign particles adhered to the mirror surface or X-ray window surface, or distribution of surface roughness on the mirror surface, for example.

Figure 11:
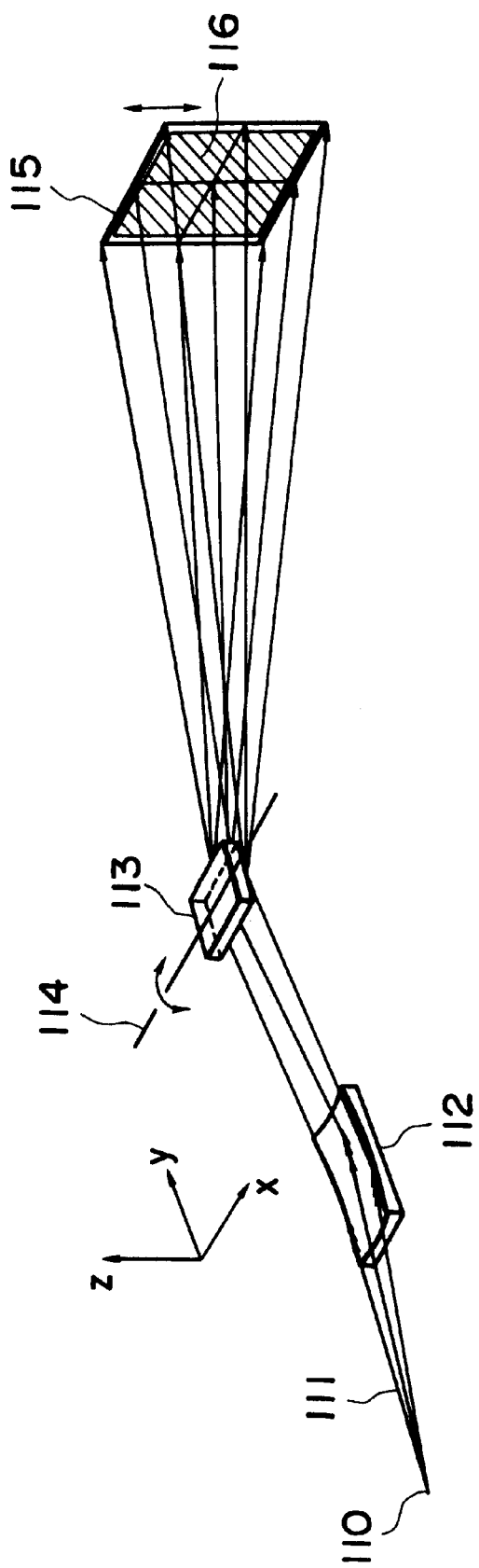
FIG. 11 is a schematic and perspective view for explaining fine rotary oscillation of a second mirror, in an embodiment of the present invention.

FIG. 11 is a schematic and perspective view for explaining minute rotatory oscillation of a second mirror, in an embodiment of the present invention. Denoted in the drawing at 110 is a light source, and denoted at 111 is synchrotron radiation light emitted in the vertical direction. Denoted at 112 is a first mirror, and denoted at 113 is a second mirror. Denoted at 114 is a rotational X axis, and denoted at 115 is an irradiation region. Denoted at 116 is an exposure region.

Figure 12A:
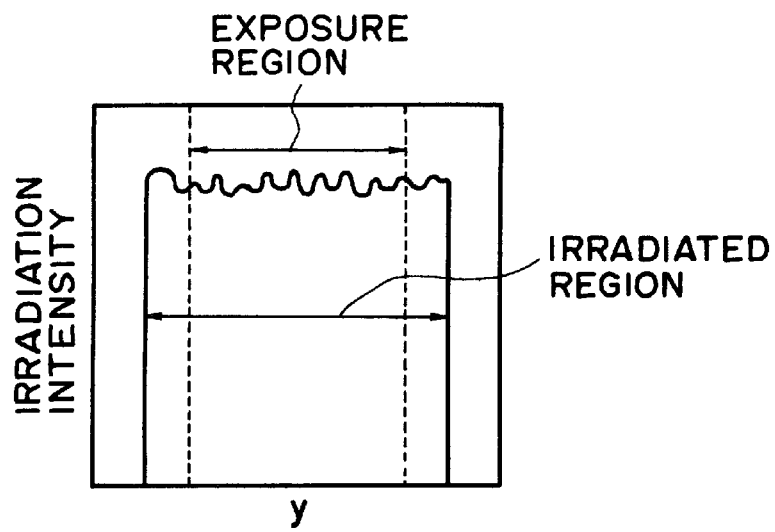
Figure 12B:
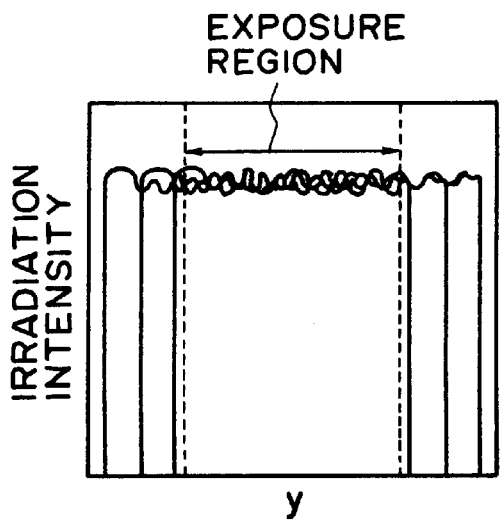
Figure 12C:
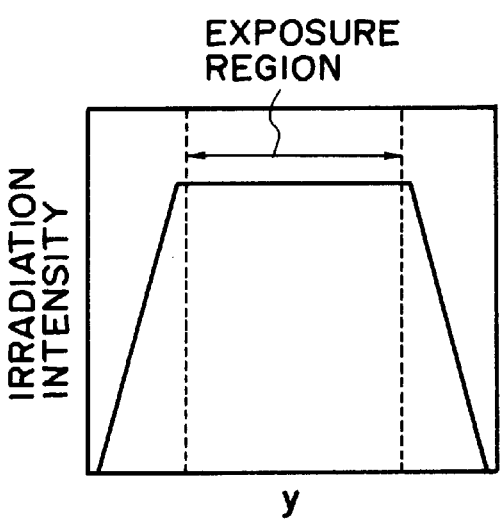

FIGS. 12A–12C are schematic views, respectively, for explaining the concept of minute oscillation and embodied forms therefor, wherein FIG. 12A shows an irradiation intensity on a mask surface before a mirror minute scan, FIG. 12B shows a shift of irradiation intensity on the mask surface with the mirror minute scan, and FIG. 12C shows an irradiation intensity on the mask surface after the mirror minute scan.

Without a shape error of the mirror or X-ray window, a scratch on the mirror surface, dust or foreign particles adhered to the mirror or X-ray window surface or distributed surface roughness on the mirror surface, the power absorbed by a resist within the irradiation region, particularly within the exposure region, is uniform. However, with respect to X-rays or vacuum ultraviolet rays, only a small mirror shape error or non-uniformness of thickness of the X-ray window, for example, causes non-uniformness of irradiated intensity of X-rays or vacuum ultraviolet rays. As a result, there occurs a non-uniformness of irradiation intensity within the irradiation region, such as illustrated in FIG. 12A. If, as shown in FIG. 11, the second mirror is rotationally oscillated about the rotational X axis 114 and, additionally, it is minutely oscillated within a range in which the edge of the irradiation region 115 does not enter the exposure region 116, the non-uniformness of irradiation intensity displaces within the exposure region as shown in FIG. 12B. As a result of this, as shown in FIG. 12C, the average of irradiation intensity within the exposure region becomes substantially uniform.

If the mirror is rotationally oscillated largely so that the edge of the irradiation region enters the exposure region, a portion wherein the irradiation intensity is continuously small comes into the exposure region. This is undesirable.

On the other hand, if there is a large non-uniformness of irradiation intensity within the exposure region when the mirror is oscillated under the condition that the edge of the irradiation intensity does not enter the exposure region, an averaging effect of irradiation intensity with the minute oscillation of the second mirror becomes insufficient. The averaging effect of non-uniformness with a minute oscillation of the second mirror is notable in a case where the period of non-uniformness is smaller than the distance of shift of non-uniformness. If the period of non-uniformness is about twice the distance of shift of non-uniformness, the non-uniformness will become about $1/\pi$. When the maximum value of the irradiation intensity is twice the minimum value thereof and the average of the irradiation intensity has a value intermediate thereof, the non-uniformness of the irradiation intensity will be $\pm 0.5/1.5$, and $\pm 33\%$. In that case, if the non-uniformness becomes $1/\pi$ as a result of a shift of non-uniformness, then the non-uniformness will be $\pm 33/\pi$, and about $\pm 10.5\%$. Since non-uniformness during an exposure process should be not greater than $\pm 10\%$, the maximum value of irradiation intensity should be not greater than twice the minimum value thereof. In a case wherein the period of non-uniformness is twice or more the distance of a shift of non-uniformness, the averaging effect of non-uniformness of the irradiation intensity becomes very small.

As described, by minute rotary oscillation, it is possible to reduce non-uniformness of the irradiation intensity resulting from shape error of the mirror or X-ray window, a scratch on the mirror surfaces, dust or foreign particles adhered to the mirror or X-ray window surface, or distribution of surface roughness on the mirror surface, for example. Further, in this embodiment, the size of the second mirror is made small and this facilitates minute oscillation.

While in this embodiment rotational minute oscillation of the second mirror is used to shift non-uniformness of the irradiation intensity within the exposure region, it may be made in combination with minute straight oscillation. Alternatively, the first mirror may be minutely rotated or it may be oscillated straight. Since non-uniformness of exposure resulting from a scratch of an optical element or a shape error thereof can be removed best as the synchrotron radiation light impinging on the wafer is oscillated upwardly and downwardly by the minute oscillation of the mirror, the axis of rotational oscillation of the mirror may desirably be taken on the axis of the X direction. A similar advantageous result is obtainable by rotating the mirror while using, as an axis, a straight line having an angle deviated from the normal to the mirror.

While the invention has been described with reference to an exposure apparatus of a simultaneous exposure system, the invention is applicable also to scan exposure system.

As described above, a first mirror may have a concave shape with respect to both the X and Y directions and a second mirror may have a convex shape with respect to the Y direction. With this arrangement, the light having a strong intensity as emitted along the synchrotron radiation orbital plane is projected substantially as a straight line upon the mask. As a result, the whole exposure area can be illuminated with a substantially uniform intensity and, therefore, in a lithographic process, the uniformness of the line width can be improved significantly.

Further, a curvature radius $r_x$ of a first mirror near the center thereof in the X axis direction and a curvature radius $r_y$ thereof in the Y axis direction may have a relation $|r_x|<|r_y|$. With this arrangement, changes in the X and Y directions can be approximated. This is because, comparing the effect of changing, in the X direction, the light rays which advance in the Y direction, through the same X direction curvature radius and Y direction curvature radius, the force of changing it in the Z direction is larger.

Moreover, the distance between a second mirror and a mask may be not less than 1000 mm, by which divergence of the synchrotron radiation light can be kept not greater than 5 mrad. Thus, a change of alignment precision due to a change in gap between the mask and the wafer can be held within a tolerable range.

Additionally, by collecting synchrotron radiation light emitted from a light source with a large divergence angle in the horizontal direction, the intensity of light projected to the mask can be increased and, thus, the throughput can be enlarged.

first mirror may have a curvature radius in the Y direction which satisfies a condition:

$$r_{1y} > 2l_1 l_2 / [11(l_1+l_2) \sin \theta].$$

With this arrangement, excessive expansion of light emitted in a direction perpendicular to the synchrotron radiation orbital plane, at the position of the second mirror can be prevented. When a condition $$r_{1y} > 2l_1 l_2 / [(l_1+l_2)] \sin \theta$$

is satisfied or the curvature radius of the first mirror in the X direction satisfies the following condition:

$$r_{1x} < 2 \sin \theta / [1/l_1 + (3/2)/l_2]$$

or $$r_{1x} < 2 \sin \theta / [1_1 + (2/3)/l_2],$$

a further desirable exposure apparatus can be provided.

If there is a shape error of the mirror or X-ray window, a scratch on the mirror surface, dust or foreign particles adhered to the mirror or X-ray window surface, or a distribution of surface roughness on the mirror surface, the mirror may be minutely oscillated, by which the whole exposure region can be illuminated with a uniform intensity. This enables improvement of uniformness of the line width, in a lithographic process.

Since synchrotron radiation light from the first mirror may be collected with respect to the vertical direction, at a position upstream of the second mirror, this enables a reduction in length of the second mirror with respect to the irradiation direction, and a reduction in size and weight of the second mirror. It is very effective to improve the work precision and to facilitate minute oscillation of the same.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for transferring, by exposure, a pattern of a mask onto a substrate to be exposed, with use of radiation light from a synchrotron radiation light source, said apparatus comprising:

a first mirror for collectively reflecting radiation light from the synchrotron radiation light source; and a second mirror for reflecting radiation light from said first mirror and for projecting the reflected light to the mask by which the pattern of the mask is transferred to the substrate, wherein, when a light ray advancing from a light emission point of the synchrotron radiation light source toward a center of a predetermined region of the mask, to be transferred to the substrate, is taken as a chief ray, when a normal to each of said first and second mirrors at an incidence position of a corresponding chief ray is taken as a Z axis, when a direction perpendicular to a plane defined by the Z axis of each mirror and a corresponding chief ray is taken as an X axis, and when a Y axis is taken along a direction perpendicular to the Z axis and X axis of each mirror, said first mirror has a reflection surface of a shape which is concave with respect to the X axis direction and concave with respect to the Y axis direction, while said second mirror has a reflection surface of a shape which is convex with respect to the Y axis direction, wherein the reflection surface shapes and disposition of said first and second mirrors are determined so that the light rays, emitted from the synchrotron radiation light source with divergence along an orbital plane and projected by way of said first and second mirrors, are projected in a substantially straight line upon one of the mask and the substrate, and wherein, when a distance from the light emission point to the incidence position of the chief ray upon said first mirror is $l_1$, a distance between incidence positions of chief rays on said first and second mirrors, respectively, is $l_2$, a distance from the incidence position of a chief ray on said second mirror to the mask is $l_3$, a glancing angle to said first mirror is $\theta$, a curvature radius of said first mirror in the X axis direction is $r_{1x}$ and a curvature radius of said first mirror in the Y axis direction is $r_{1y}$, the following relation is satisfied:

$$r_{1y} > 2l_1 l_2 / [11(l_1+l_2) \sin \theta].$$

2. An apparatus according to claim 1, wherein a curvature radius $r_x$ of said first mirror in the X axis direction and a curvature radius thereof in the Y axis direction satisfy a relation:

$$|r_x| < |r_y|.$$

3. An apparatus according to claim 1, wherein the following relation is satisfied:

$$2l_1 l_2 / [11(l_1+l_2) \sin \theta] < r_{1y} < 2l_1 l_2 / [(l_1+l_2) \sin \theta].$$

4. An apparatus according to claim 1, wherein the following relation is satisfied:

$$r_{1x} < 2 \sin \theta / [(1l_1) + \{(3/2)/l_2\}].$$

5. An apparatus according to claim 1, wherein the following relation is satisfied:

$$r_{1x} > 2 \sin \theta / [(1/l_1) + \{(2/3)/l_2\}].$$

6. An apparatus according to claim 1, wherein a distance between said second mirror and the mask is not less than 1000 mm.

7. An apparatus according to claim 1, wherein said first and second mirrors serve to expose the predetermined region on the mask at once.

8. An apparatus for transferring, by exposure, a pattern of a mask onto a substrate to be exposed, with use of radiation light from a synchrotron radiation light source, said apparatus comprising:

a first mirror for collectively reflecting radiation light from the synchrotron radiation light source; and a second mirror for reflecting radiation light from said first mirror and for projecting the same to the mask by which the pattern of the mask is transferred to the substrate, wherein, when a light ray advancing from a light emission point of the synchrotron radiation light source toward a center of a predetermined region of the mask, to be transferred to the substrate, is taken as a chief ray, when a normal to each of said first and second mirrors at an incidence position of a corresponding chief ray is taken as a Z axis, when a direction perpendicular to a plane defined by the Z axis of each mirror and a corresponding chief ray is taken as an X axis, and when a Y axis is taken along a direction perpendicular to the Z axis and X axis of each mirror, said first mirror has a reflection surface of a shape which is concave with respect to the X axis direction and concave with respect to the Y axis direction, while said second mirror has a reflection surface of a shape which is convex with respect to the Y axis direction, wherein the reflection surface shapes and disposition of said first and second mirrors are determined so that the radiation light from the synchrotron radiation light source and projected by way of said first and second mirrors illuminates the whole of the predetermined region of the mask at once, and wherein a curvature radius of the reflection surface of said first mirror in the Y axis direction and in a portion adjacent to the incidence position of the chief ray is so set that light rays emitted from the synchrotron radiation light source along a plane perpendicular to an orbital plane are substantially collected by said first mirror at a position before incidence on said second mirror.

9. An apparatus according to claim 8, wherein, when a distance from the light emission point to the incidence position of the chief ray upon said first mirror is $l_1$, a distance between incidence positions of chief rays on said first and second mirrors, respectively, is $l_2$, a distance from the incidence position of a chief ray on said second mirror to the mask is $l_3$, a glancing angle to said first mirror is $\theta$, a curvature radius of said first mirror in the X axis direction is $r_{1x}$ and a curvature radius of said first mirror in the Y axis direction is $r_{1y}$, the following relation is satisfied:

$$r_{1y} > 2l_1 l_2 / [11(l_1+l_2) \sin \theta].$$

10. An apparatus according to claim 9, wherein the following relation is satisfied:

$$2l_1 l_2 / [11(l_1+l_2) \sin \theta] < r_{1y} < 2l_1 l_2 / [(l_1+l_2) \sin \theta].$$

11. An apparatus according to claim 9, wherein the following relation is satisfied:

$$r_{1x} < 2 \sin \theta / [(1/l_1) + \{(3/2)/l_2\}].$$

12. An apparatus according to claim 9, wherein the following relation is satisfied;

$$r_{1x} > 2 \sin \theta / [(1/l_1) + \{(2/3)/l_2\}].$$

13. An apparatus according to claim 8, wherein said second mirror is arranged for one of rotational oscillation and straight oscillation.

14. An apparatus according to claim 13, wherein a central axis of rotational oscillation of said second mirror is substantially along the X axis direction.

15. An apparatus according to claim 13, wherein said second mirror is movable straight substantially along the Y axis direction.

16. An apparatus according to claim 13, wherein said first and second mirrors are so set that a maximum value of irradiation intensity of radiation light within the predetermined region of the mask, to be transferred to the substrate, is not greater than twice of a minimum thereof.

* * * * *

UNITED STATES PATENT AND TRADEMARK OFFICE
CERTIFICATE OF CORRECTION

PATENT NO.   : 6,167,111
DATED         : December 26, 2000
INVENTOR(S)  : Yutaka Watanabe, et al.

Page 1 of 1

It is certified that error appears in the above-identified patent and that said Letters Patent is hereby corrected as shown below:

<u>Title page,</u>
Item [56], "References Cited" under "U.S. Patent Documents" "5,448,612  9/1995 Kasumi et al." should read -- 5,488,612  9/1995 Kasumi et al. --.

<u>Column 3,</u>
Line 40, "s" should read -- is --.

<u>Column 11,</u>
Line 34, "$r_{1y}2l_1l_2/ [ (l_1+l_2)\sin\theta ]$" should read -- $r_{1y}<2l_1l_2/ [ (l_1+l_2)\sin\theta]$ --.

<u>Column 12,</u>
Line 3, "$f_{1x}<1/[1l_1+(3/2)/l_2]$" should read -- $f_{1x}<1/[1/l_1+(3/2)/l_2]$ --.

<u>Column 15,</u>
Line 1, "first" should read -- The first --.
Line 11, "$r_{1y}>2l_1l_2/ [ (l_1+l_2)\sin\theta.$ " should read -- $r_{1y}<2l_1l_2/ [ (l_1+l_2)]\sin\theta.$ --.
Line 19, "$r_{1x}<2 \sin\theta / [l_1+(2/3) / l_2],$" should read -- $r_{1x}<2 \sin\theta / [1/l_1+(2/3) / l_2],$ --.

<u>Column 16,</u>
Line 34, "$r_{1x}<2 \sin\theta / [ (1l_1) + \{ (3/2) / l_2 \} ].$" should read -- $r_{1x}<2 \sin\theta / [ (1/l_1) + \{ (3/2) / l_2 \} ],$ --.

<u>Column 18,</u>
Line 28, "of" should be deleted.

Signed and Sealed this

Twenty-seventh Day of November, 2001

Attest:

*Nicholas P. Godici*

NICHOLAS P. GODICI
*Attesting Officer*   *Acting Director of the United States Patent and Trademark Office*